United States Patent
Chen et al.

(10) Patent No.: US 10,912,231 B1
(45) Date of Patent: Feb. 2, 2021

(54) AUTOMOTIVE INTEGRATED POWER MODULE AND CAPACITOR

(71) Applicant: Ford Global Technologies, LLC, Dearborn, MI (US)

(72) Inventors: Lihua Chen, Farmington Hills, MI (US); Fan Wang, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 16/743,698

(22) Filed: Jan. 15, 2020

(51) Int. Cl.
*H05K 7/20* (2006.01)
*H01L 23/473* (2006.01)

(52) U.S. Cl.
CPC ....... *H05K 7/20872* (2013.01); *H01L 23/473* (2013.01); *H05K 7/20509* (2013.01); *H05K 7/20927* (2013.01)

(58) Field of Classification Search
CPC .......... H05K 7/20254; H05K 7/20509; H05K 7/20872; H05K 7/20927
See application file for complete search history.

(56) References Cited

U.S. PATENT DOCUMENTS

| | | | | |
|---|---|---|---|---|
| 5,633,784 A | * | 5/1997 | Bouton | H05K 7/20927 361/716 |
| 8,451,609 B2 | * | 5/2013 | Olesen | H01L 23/473 361/699 |
| 8,780,557 B2 | | 7/2014 | Duppong et al. | |
| 8,867,210 B2 | * | 10/2014 | Harmelink | H05K 7/20254 361/699 |
| 9,165,858 B2 | | 10/2015 | Steger et al. | |
| 9,445,532 B2 | | 9/2016 | Chen et al. | |
| 10,284,105 B2 | * | 5/2019 | Hagimoto | H01L 21/4878 |
| 10,475,724 B2 | * | 11/2019 | Machler | H01L 21/4882 |

FOREIGN PATENT DOCUMENTS

| | | | | |
|---|---|---|---|---|
| EP | 2521432 A2 | * | 11/2012 | ......... H05K 7/20927 |
| WO | WO-2009100798 A1 | * | 8/2009 | ......... B60R 16/0239 |

* cited by examiner

*Primary Examiner* — Robert J Hoffberg
(74) *Attorney, Agent, or Firm* — David B. Kelley; Brooks Kushman P.C.

(57) ABSTRACT

An integrated power module includes a base case defining an internal manifold, and an interface surface comprising a plurality of inlet apertures and outlet apertures each in fluid communication with the internal manifold. The integrated power module also includes a plurality of power cards fastened to the base case and in direct contact with the interface surface. Each of the power cards has a bottom cover defining an inner surface and an outer surface, a base plate sealed with the bottom cover, a substrate secured on the base plate such that the base plate is between the substrate and bottom cover, and an integrated circuit disposed on the substrate. The inner surface and the base plate define a cooling channel configured to direct coolant from one of the inlet apertures, through the power card, and to one of the outlet apertures.

15 Claims, 4 Drawing Sheets

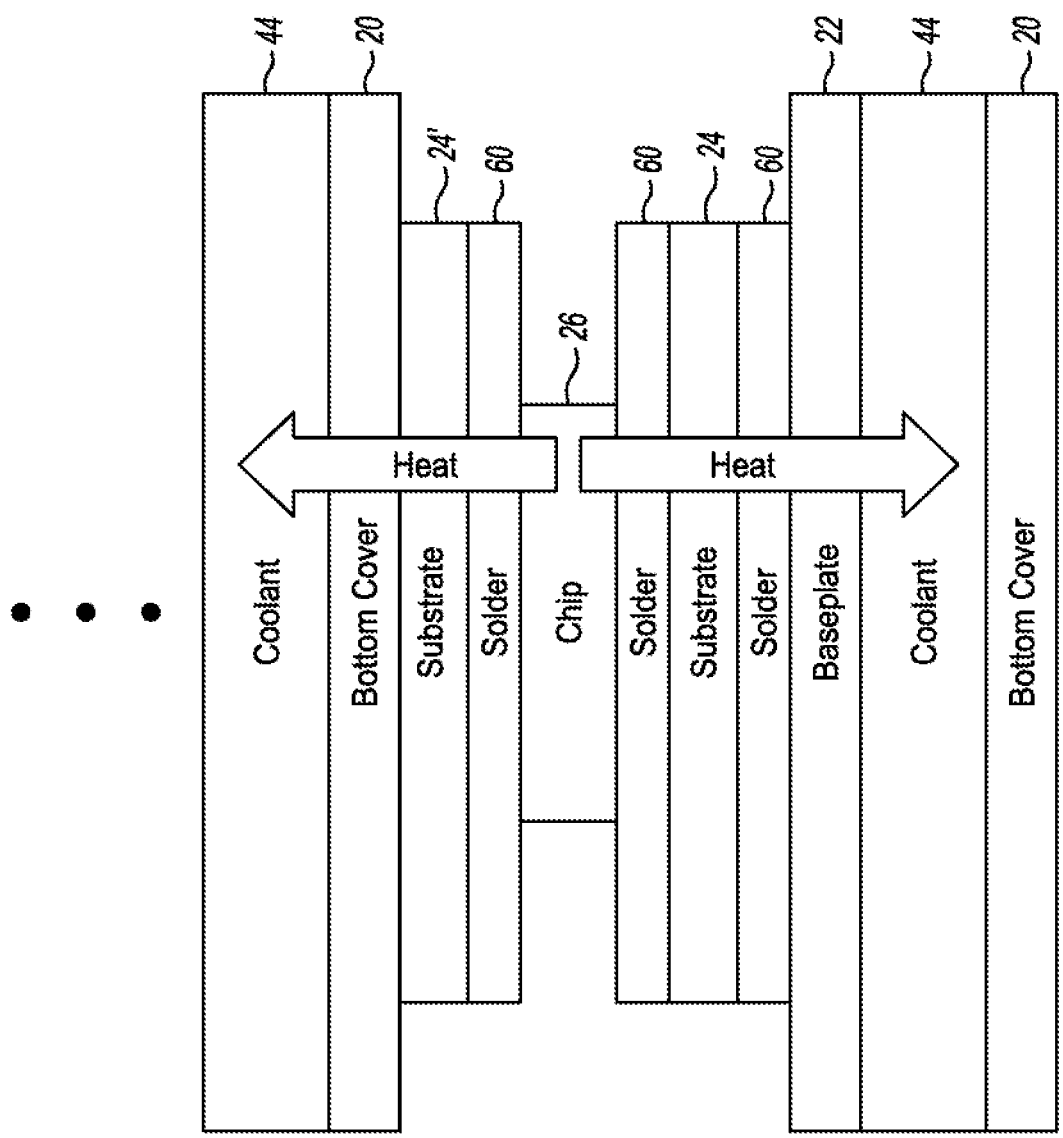

AUTOMOTIVE INTEGRATED POWER MODULE AND CAPACITOR

TECHNICAL FIELD

This disclosure relates to the packaging and cooling of automotive power electronics components.

BACKGROUND

An electric or hybrid vehicle may contain one or more motors for propulsion. The vehicle may also contain a traction battery as a source of energy for the motor, and a generator to charge the traction battery. As the motor, traction battery, and generator may require varying electrical parameters, electrical communication between them may require modification of the power provided or consumed. This modification may produce heat.

SUMMARY

An integrated power includes a base case, a plurality of power cards, and a capacitor. The base case defines an internal manifold, and an interface surface comprising a plurality of inlet apertures and outlet apertures each in fluid communication with the internal manifold. The plurality of power cards are fastened to the base case and are in direct contact with the interface surface. Each of the power cards has a bottom cover defining an inner surface and an outer surface, a base plate sealed with the bottom cover, a substrate secured on the base plate such that the base plate is between the substrate and bottom cover, and an integrated circuit disposed on the substrate. The inner surface and the base plate define a cooling channel configured to direct coolant from one of the inlet apertures, through the power card, and to one of the outlet apertures to promote heat transfer from the integrated circuit through the substrate and base plate to the coolant and from an integrated circuit of an adjacent one of the power cards through the outer surface, a body of the bottom cover, through the inner surface, and to the coolant. The capacitor is fastened to the base case and against one of the power cards to provide a clamping force to urge the plurality of power cards together.

BRIEF DESCRIPTION OF THE DRAWINGS

FIG. 5 is a side view, in cross-section, of a portion of a plurality of stacked power cards.

DETAILED DESCRIPTION

Figure 1:
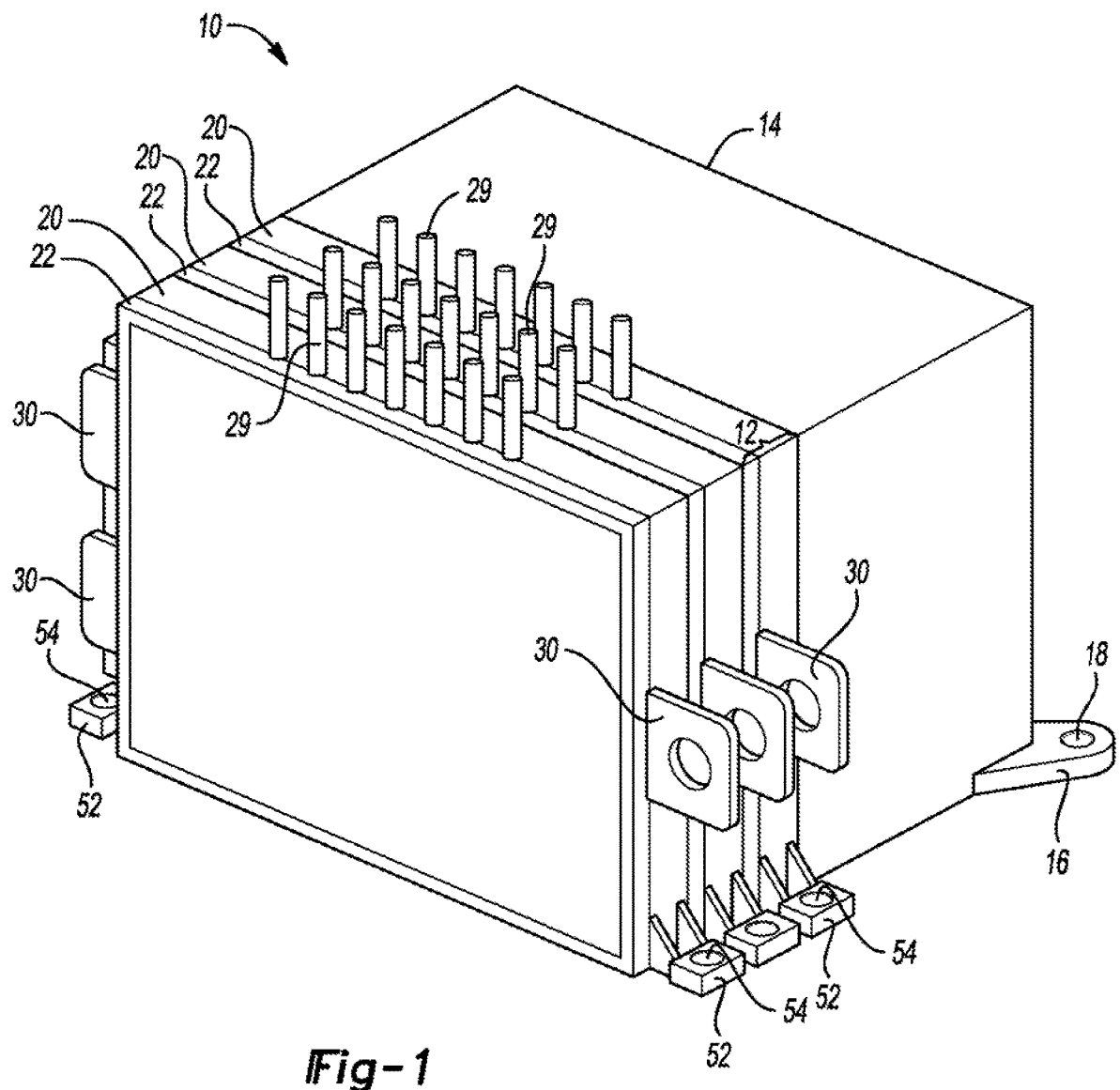
FIG. 1 is a perspective view of a portion of an integrated power module.

Various embodiments of the present disclosure are described herein. However, the disclosed embodiments are merely exemplary and other embodiments may take various and alternative forms that are not explicitly illustrated or described. The figures are not necessarily to scale; some features may be exaggerated or minimized to show details of particular components. Therefore, specific structural and functional details disclosed herein are not to be interpreted as limiting, but merely as a representative basis for teaching one of ordinary skill in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. However, various combinations and modifications of the features consistent with the teachings of this disclosure may be desired for particular applications or implementations.

An inverter system controller is an apparatus used to transfer and control power between power generating and consuming devices. The inverter system controller may contain a 3-phase inverter. The inverter may be used to convert DC electrical power from a traction battery into AC electrical power usable by a motor. In alternate embodiments, the inverter system controller may contain a 3-phase rectifier. The rectifier may be used to convert AC electrical power from a generator to DC electrical power which may charge a traction battery. Some embodiments may contain both a 3-phase inverter and a 3-phase rectifier, in which a traction battery may be used to provide electrical power to a motor through the inverter, and a generator may be used to charge a battery through the rectifier.

An inverter system controller may contain a plurality of electrical bus networks and a voltage converter. The inverter system controller may designate one of the electrical bus networks for high-voltage, and another of the electrical bus networks for low-voltage. For example, the traction battery may be directly connected to the high-voltage bus network, while a generator and a motor may be directly connected to the low-voltage bus network. In other embodiments, the inverter system controller may designate one of the electrical bus networks for DC electrical power, and another for AC electrical power. The voltage converter may be used to facilitate electrical communication between the electrical bus networks, as well as between the devices connected to varying electrical bus networks. The voltage converter may be used to convert low-voltage power produced by a generator and placed on a low-voltage bus network into high-voltage power for charging the traction battery.

An inverter system controller may contain a power card and DC-link capacitor. In some embodiments, the voltage converter may be comprised of the power card and DC-link capacitor. In other embodiments, the power card and DC-link capacitor may be stand-alone systems. The power card and capacitor may be in electrical communication through an electrical bus network. As the power card and capacitor may be used to modify electrical parameters, including high voltage, the power card and capacitor may generate heat. Appropriate cooling and spatial isolation may be used to reduce neighboring effects of generated heat. Still, the power card and capacitor may produce less DC inductance if closer in proximity to each other.

An embodiment of the inverter system controller that allows for closer spatial relation between the power card and the capacitor includes a baseplate, a power card, and a capacitor. The baseplate may be used to support the power card and the capacitor. In some embodiments, the baseplate contains an interface surface capable of supporting a plurality of power cards and capacitors. In embodiments containing a plurality of power cards, the power cards may be stacked. A power card may thus be in direct physical contact with an adjacent power card.

The baseplate may use a plurality of cavities accessible through a plurality of inlet and outlet apertures disposed in the interface surface. In some embodiments, the apertures may be disposed in a recessed surface of the supporting surface. The baseplate may also contain a non-circular recess to fasten a capacitor. The plurality of cavities may define inlet and outlet manifolds.

The manifolds may further be accessible by the inlet and outlet apertures, generally perpendicular to the supporting surface. In other embodiments, the inlet and outlet are not generally perpendicular to the supporting surface. The combination of the inlet, some of the plurality of apertures, and one of the plurality of cavities may serve as an inlet manifold. Similarly, the combination of the outlet, other of the plurality of apertures, and other of the plurality of cavities may serve as an outlet manifold. In some embodiments, the inlet manifold may be isolated from the outlet manifold within the baseplate. In other embodiments, the inlet manifold and outlet manifold may be combined within the baseplate.

The power card may include a bottom cover, a cooling plate, and a top cover. The bottom cover, cooling plate, and top cover may cooperate to form a cooling channel within the power card. In other embodiments, the channel may be fully disposed in one of the bottom cover, cooling plate, and top cover. The bottom cover, cooling plate, and top cover may further cooperate to form an inlet and outlet. The inlet and outlet may be substantially parallel.

The power card may be disposed on the baseplate. The power card may further be fastened to the baseplate. The inlet of the power card may cooperate with the inlet manifold of the baseplate and the outlet of the power card may cooperate with the outlet manifold of the baseplate, wherein both combinations provide fluid access between some of the pluralities of the cavities in the baseplate and the cooling channel of the power card. As the inlet of the power card is in fluid communication with the outlet of the power card, the combination of the baseplate and the power card may provide a pathway for fluid communication for the inlet manifold and the outlet manifold of the baseplate.

The fluid communication between the baseplate and power cards may be water tight. A sealing gasket may be used to create a water tight seal. The sealing gasket may be an O-ring. The sealing gasket may be of variable thickness to compensate varying normal and perpendicular forces. The sealing gasket may be capable of aiding a water tight seal between a single aperture of the baseplate and an inlet or outlet of a power card. Alternatively, the sealing gasket may be capable aiding a water tight seal between a plurality of apertures of the baseplate, and a plurality of inlets and outlets of power cards.

The power card may contain a volume formed for the mounting of integrated circuits. The mount may be comprised of a first layer of soldering material, in thermal communication with a layer of substrate, in thermal communication with a second layer of soldering material, in thermal communication with the cooling plate, in thermal communication with the coolant, wherein an integrated circuit placed in the power card would be in thermal communication with the first layer of solder. The layer of substrate may be copper based. In embodiments capable of cooling multiple sides of integrated circuits, the power card may further contain a second integrated circuit mount, comprised of a layer of soldering material, in thermal communication with a layer of a substrate. The layer of substrate of the second mount may be in thermal communication with the bottom cover and further with the coolant of an adjacent power card.

The capacitor may be disposed on the baseplate. The capacitor may further be fastened to the baseplate. The capacitor may be stacked with a power card, wherein the capacitor is in physical contact with an adjacent power card so that it can be cooled by a cold plate thereof. The capacitor may be biased towards an adjacent power card. The fasteners attaching the capacitor to the baseplate may cause a biasing force, compressing the capacitor into the power cards. In other embodiments, the surface of the capacitor opposite the power cards may further comprise a spring to compress the capacitor away from the area of spring assembly. The fastening support of the capacitor may be non-circular, to cooperate with a non-circular recess of the baseplate.

A method for assembling a baseplate, a plurality of power cards, and a capacitor to form an inverter system controller is described. A first step is to install a sealing gasket for sealing the inlet manifold and outlet manifold of the baseplate. Some embodiments may use more than two sealing gaskets to completely seal the manifolds. Other embodiments may use a single gasket. A second step may be installing a power card onto the baseplate. The power card should be installed at the furthest position allowable in respect to the capacitor. The power card may be firmly fastened to the baseplate. A third step may be installing other power cards. The other power cards should be installed between the first power card and the area designated for the capacitor. The other power cards may be partially fastened to the baseplate. A fourth step may be installing the capacitor to the baseplate. The capacitor may be partially fastened to the baseplate. A fifth step may be applying the biasing assembly to the capacitor. This may be a spring. A sixth step may be fully fastening the capacitor and the remaining partially fastened power cards.

Figure 2:
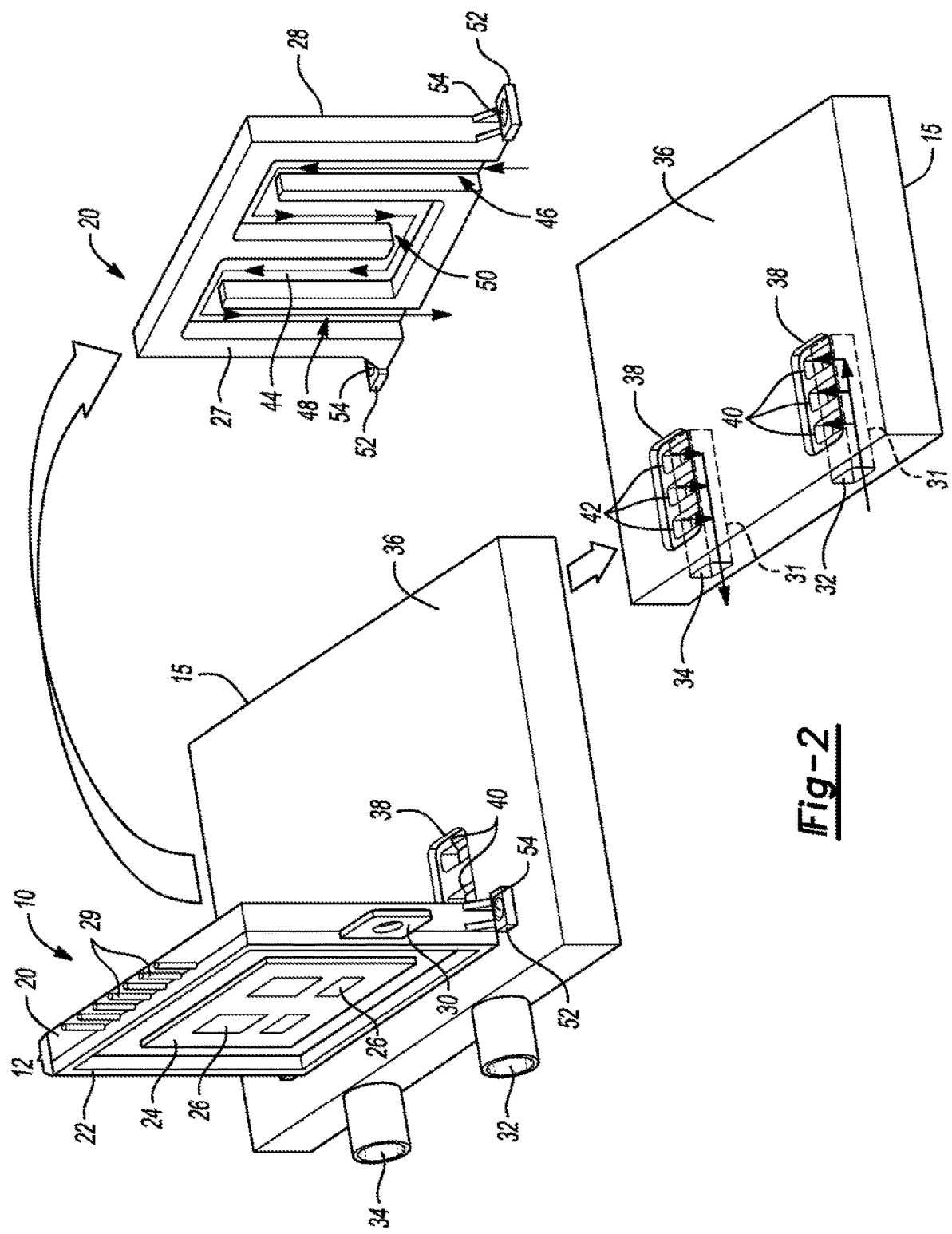
FIGS. 2 and 3 are exploded assembly views of portions of the integrated power module of FIG. 1.

FIGS. 1 and 2 show an integrated power module 10 that includes a plurality of stacked power cards 12 (three in this example) and a capacitor 14 (e.g., DC link capacitor) adjacent thereto all mounted on a base case 15. The capacitor 14 is in physical contact with an adjacent one of the power cards 12 and as discussed below, provides a clamping force thereto to urge the power cards 12 together.

The capacitor 14 in this example includes a pair of mounting arms 16 on corners thereof opposite the end in contact with the power cards 12. Each of the mounting arms 16 includes a mounting slot 18 that can receive a fastener to secure the mounting arm 16 to the base case 15.

Each of the power cards 12 includes a bottom cover 20, a base plate 22, a substrate 24, and integrated circuits 26. As apparent to those of ordinary skill, the power card 12 defining the end of the stack does not include the substrate 24 and integrated circuits 26. The bottom cover 20 defines inner and outer surfaces 27, 28. The base plate 22 is sealed with the inner surface 27 of the bottom cover 20. The substrate 24 is secured on the base plate 22 such that the base plate 22 is between the substrate 24 and bottom cover 20. The integrated circuits 26 are disposed on the substrate 24. Each of the power cards also include also includes signal pins 29 and terminals 30 for electrical communication with the integrated circuits 26, etc.

The base case 15 defines an internal manifold 31 that has an inlet 32 and outlet 34. The internal manifold 31 is not continuous within the base case 15. That is, coolant flowing into the internal manifold 31 must first travel through one of the power cards 12 before exiting the internal manifold 31. A top surface 36 of the base case 15 defines recessed areas 38 surrounding inlet and outlet apertures 40, 42 respectively, that provide access to the internal manifold 31.

The inner surface 27 and the base plate 22 define a cooling channel 44 that directs coolant from one of the inlet apertures 40, through the power card 12, and to one of the outlet apertures 42 to promote heat transfer from the integrated circuits 26, through the substrate 24 and base plate 22, and to the coolant, and from the integrated circuit 26 of an adjacent one of the power cards 12 through the bottom cover 20, and to the coolant.

In the example of FIG. 2, the cooling channel 44 has inlet and outlet sections 46, 48, and a serpentine middle section 50 between the inlet and outlet sections 46, 48. The inlet and outlet section 46 48 are in fluid communication with the inlet and outlet apertures 40, 42. As such, the flow of coolant through the inlet section 46 is opposite that of the outlet section 48. Moreover, the flow of coolant through the inlet and outlet sections 46, 48 is generally perpendicular to the flow of coolant through the internal manifold 31.

FIG. 2 also shows the cooperation between the base case 15 and one of the power cards 12. In this embodiment, the power card 12 sits on the top surface 36 and over the inlet and outlet apertures 40, 42 such that, as mentioned above, the inlet and outlet sections 46, 48 are in fluid communication with the internal manifold 31. Coolant flows into the internal manifold 31 via the inlet 32, through one of the inlet apertures 40, and into the cooling channel 44. Coolant then flows from the cooling channel 44, through one of the outlet apertures 42, and into the internal manifold 31 to exit the base case 15 via the outlet 34.

Each of the bottom covers 20 are further provided with mounting legs 52 on opposite sides that define bore holes 54 that can receive fasteners to mount the power cards 12 to the base case 15.

Figure 3:
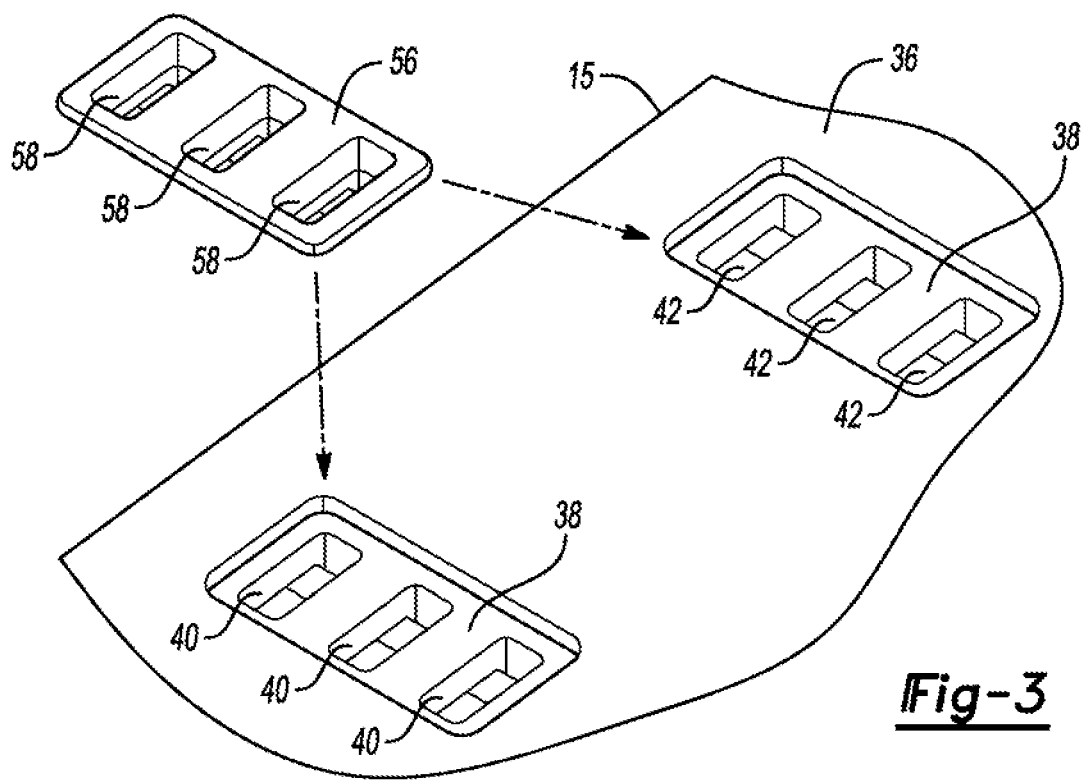

FIG. 3 shows an embodiment of a sealing gasket 56 that seals between the power cards 12 and base case 15. The sealing gasket 56 is seated within the recessed area 38 and includes openings 58 that correspond with the various apertures. The power cards 12 when mounted to the base case 15 compress against the sealing gasket 56 to ensure a liquid tight seal.

Figure 4:
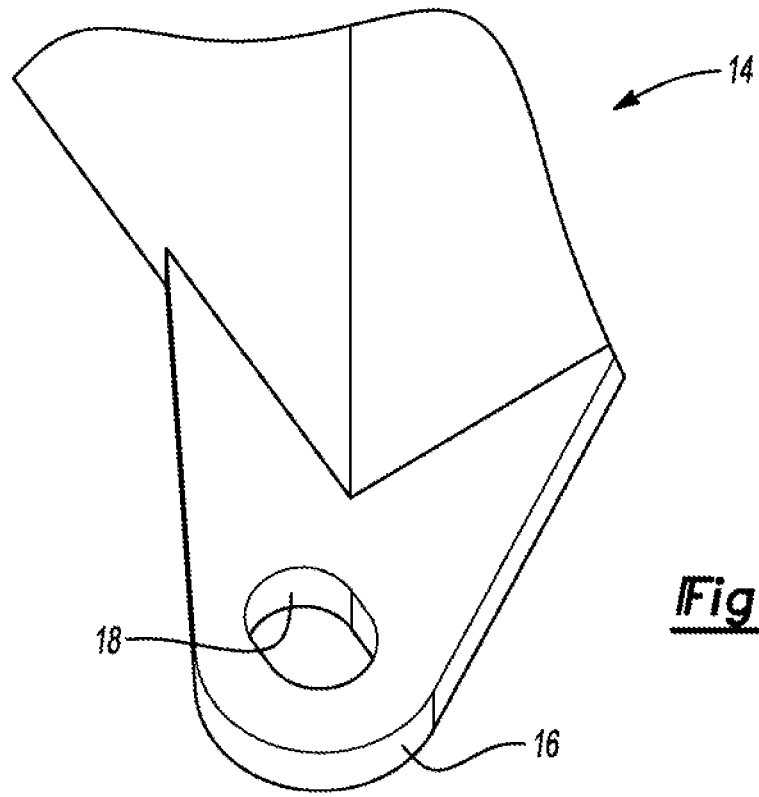
FIG. 4 is a perspective view of a portion of the integrated power module of FIG. 1.

FIG. 4 shows a portion of the capacitor 14. In this example, the mounting slot 18 is oblong. The capacitor 14 can thus be slid toward the power cards 12 during assembling such that the capacitor 14 can apply a compression force to the power cards 12.

FIG. 5 shows a side view in cross-section of a stack of the power cards 12. In this embodiment, an additional substrate 24' is mounted over the integrated circuit 26 to be in contact with the bottom cover 20 of an adjacent one of the power cards 12. Solder 60 is used to attach the substrates 24, 24' with the integrated circuit 26, and to attach the substrate 24 with the base plate 22. As such, the integrated circuit 26 is in thermal communication with the cooling channels 44 on either side thereof (double-sided cooling). Other arrangements are also possible. The additional substrate 24' and corresponding solder 60 may be absent for example, etc. (single sided cooling).

The words used in the specification are words of description rather than limitation, and it is understood that various changes may be made without departing from the spirit and scope of the disclosure and claims. As previously described, the features of various embodiments may be combined to form further embodiments that may not be explicitly described or illustrated. While various embodiments may have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. An integrated power module comprising:
   a base case defining an internal manifold, and an interface surface comprising a plurality of inlet apertures and a plurality of outlet apertures each in fluid communication with the internal manifold;
   a plurality of power cards fastened to the base case and in direct contact with the interface surface, wherein each of the power cards has a bottom cover defining an inner surface and an outer surface, a base plate sealed with the bottom cover, a substrate secured on the base plate such that the base plate is between the substrate and bottom cover, and an integrated circuit disposed on the substrate, wherein the inner surface and the base plate define a cooling channel configured to direct coolant from one of the inlet apertures, through a respective one of the power cards, and to one of the outlet apertures to promote heat transfer from the integrated circuit through the substrate and base plate to the coolant and from the integrated circuit of an adjacent one of the power cards through the outer surface, a body of the bottom cover, the inner surface, and to the coolant;
   a plurality of sealing gaskets, a first one of the sealing gaskets surrounding the inlet apertures and a second one of the sealing gaskets surrounding the outlet apertures, and each of the sealing gaskets disposed between at least one of the power cards and the interface surface; and
   a capacitor fastened to the base case and against one of the power cards to provide a clamping force to urge the plurality of power cards together.

2. The integrated power module of claim 1, wherein the cooling channel has an inlet section, an outlet section, and a serpentine middle section between the inlet section and outlet section such that a direction of flow of the coolant through the inlet section is opposite that of the outlet section.

3. The integrated power module of claim 1, wherein the cooling channel has an inlet section, an outlet section, and a middle section between the inlet section and outlet section such that a direction of flow of the coolant through the inlet and outlet sections is perpendicular to a direction of flow of the coolant through the internal manifold.

4. The integrated power module of claim 3, wherein the middle section has a serpentine shape.

5. The integrated power module of claim 1, wherein one of the power cards further comprises an additional integrated circuit such that the adjacent one of the power cards has a plurality of integrated circuits.

6. The integrated power module of claim 1, wherein the interface surface further defines recesses surrounding each of the inlet apertures and outlet apertures, and wherein the sealing gaskets are disposed within the recesses.

7. The integrated power module of claim 1, wherein the capacitor is a DC link capacitor.

8. An integrated power module comprising:
   a base case defining an internal manifold, and an interface surface comprising a plurality of inlet apertures and a plurality of outlet apertures each in fluid communication with the manifold;

a first power card fastened to the base case and in direct contact with the interface surface, wherein the first power card has a first bottom cover defining a first inner surface and a first outer surface, a first base plate sealed with the first bottom cover, a first substrate secured on the first base plate such that the first base plate is between the first substrate and first bottom cover, and a first integrated circuit disposed on the first substrate, wherein the first inner surface and the first base plate define a first cooling channel in fluid communication with the internal manifold via one of the inlet apertures and one of the outlet apertures;

a second power card fastened to the base case and in direct contact with the interface surface, wherein the second power card has a second bottom cover defining a second inner surface and a second outer surface, a second base plate sealed with the second bottom cover, a second substrate secured on the second base plate such that the second base plate is between the second substrate and second bottom cover, and a second integrated circuit disposed on the second substrate, wherein the second inner surface and the second base plate define a second cooling channel in fluid communication with the internal manifold via another one of the inlet apertures and another one of the outlet apertures such that heat from the second integrated circuit is transferred to a first portion of coolant flowing through the first cooling channel via the first bottom cover and is transferred to a second portion of the coolant flowing through the second cooling channel via the second substrate and second base plate;

a plurality of sealing gaskets, a first one of the sealing gaskets surrounding the inlet apertures and a second one of the sealing gaskets surrounding the outlet apertures, and each of the sealing gaskets disposed between the first and second power cards and the interface surface; and a capacitor fastened to the base case and against the second power card to provide a clamping force to bias the first and second power cards together.

9. The integrated power module of claim 8, wherein the second cooling channel has an inlet section, an outlet section, and a serpentine middle section between the inlet section and outlet section such that a direction of flow of the coolant through the inlet section is opposite that of the outlet section.

10. The integrated power module of claim 8, wherein the second cooling channel has an inlet section, an outlet section, and a middle section between the inlet section and outlet section such that a direction of flow of the coolant through the inlet and outlet sections is perpendicular to a direction of flow of the coolant through the internal manifold.

11. The integrated power module of claim 10, wherein the middle section has a serpentine shape.

12. The integrated power module of claim 8, wherein the second power card further comprises an additional integrated circuit.

13. The integrated power module of claim 8, wherein the interface surface further defines recesses surrounding each of the inlet apertures and outlet apertures, and wherein the sealing gaskets are disposed within the recesses.

14. The integrated power module of claim 8, wherein the capacitor is a DC link capacitor.

15. A method for constructing an integrated power module comprising:

installing sealing gaskets in recesses defined by an interface surface of a base case, wherein the recesses surround inlet apertures and outlet apertures that provide fluid access to a manifold within the base case, a first one of the sealing gaskets surrounding the inlet apertures and a second one of the sealing gaskets surrounding the outlet apertures;

fastening a first power card on the base case and in direct contact with the interface surface such that the sealing gaskets form a seal between the first power card and the base case, wherein the first power card has a first bottom cover defining a first inner surface and a first outer surface, a first base plate sealed with the first bottom cover, a first substrate secured on the first base plate such that the first base plate is between the first substrate and the first bottom cover, and a first integrated circuit disposed on the first substrate, wherein the first inner surface and the first base plate define a first cooling channel in fluid communication with the internal manifold via one of the inlet apertures and one of the outlet apertures;

fastening a second power card on the base case and in direct contact with the interface surface such that the sealing gaskets form a seal between the second power card and the base case, wherein the second power card has a second bottom cover defining a second inner surface and a second outer surface, a second base plate sealed with the second bottom cover, a second substrate secured on the second base plate such that the second base plate is between the second substrate and the second bottom cover, and a second integrated circuit disposed on the second substrate, wherein the second inner surface and the second base plate define a second cooling channel in fluid communication with the internal manifold via another one of the inlet apertures and another one of the outlet apertures such that heat from the second integrated circuit is transferred to coolant flowing through the first cooling channel via the first bottom cover and is transferred to the coolant flowing through the second cooling channel via the second substrate and second base plate;

locating a capacitor adjacent to the second power card such that the second power card is disposed between the first power card and the capacitor; and fastening the capacitor to the base case such that the capacitor provides a clamping force to bias the first and second power cards together.

* * * * *